United States Patent
Teeter et al.

(10) Patent No.: US 9,423,433 B2
(45) Date of Patent: Aug. 23, 2016

(54) COMPACT POWER DETECTION CIRCUIT UTILIZING GROUND VIA COUPLING

(71) Applicant: RF Micro Devices, Inc., Greensboro, NC (US)

(72) Inventors: Douglas Andrew Teeter, Lexington, MA (US); Ming Ji, Melrose, MA (US); Praveen Varma Nadimpalli, Chandler, AZ (US)

(73) Assignee: Qorvo US, Inc., Greensboro, NC (US)

( * ) Notice: Subject to any disclaimer, the term of this patent is extended or adjusted under 35 U.S.C. 154(b) by 38 days.

(21) Appl. No.: 14/599,674

(22) Filed: Jan. 19, 2015

(65) Prior Publication Data

US 2015/0204940 A1    Jul. 23, 2015

Related U.S. Application Data

(60) Provisional application No. 61/929,108, filed on Jan. 19, 2014.

(51) Int. Cl.

| | |
|---|---|
| *H03F 1/00* | (2006.01) |
| *G01R 21/10* | (2006.01) |
| *H03F 3/195* | (2006.01) |
| *H03F 3/24* | (2006.01) |
| *H03G 3/30* | (2006.01) |

(52) U.S. Cl.
CPC .............. *G01R 21/10* (2013.01); *H03F 3/195* (2013.01); *H03F 3/245* (2013.01); *H03G 3/3036* (2013.01); *H03F 2200/204* (2013.01); *H03F 2200/411* (2013.01); *H03F 2200/451* (2013.01); *H03F 2200/465* (2013.01); *H03F 2200/541* (2013.01)

(58) Field of Classification Search
CPC ....................................................... H03F 1/00

USPC ................... 330/68, 307, 165, 195
See application file for complete search history.

(56) References Cited

U.S. PATENT DOCUMENTS

| | | | |
|---|---|---|---|
| 6,862,194 B2* | 3/2005 | Yang ................. | H02M 3/33507 363/16 |
| 2005/0045475 A1* | 3/2005 | Watanabe ........... | H01J 37/3444 204/298.08 |
| 2014/0361690 A1* | 12/2014 | Yamada ............ | H01J 37/32091 315/111.21 |

(Continued)

OTHER PUBLICATIONS

Chen, Houfei, et al., "Coupling of Large Number of Vias in Electronic Packaging Structures and Differential Signaling," 2002 IEEE MTT-S International Microwave Symposium Digest, vol. 2, Jun. 2002, pp. 983-986.

(Continued)

*Primary Examiner* — Henry Choe

(74) *Attorney, Agent, or Firm* — Withrow & Terranova, P.L.L.C.

(57) ABSTRACT

An RF electronics module includes a grounding plate, a non-conductive substrate, a number of conductive vias, RF PA circuitry, and RF power detection circuitry. The non-conductive substrate is over the grounding plate. The conductive vias extend parallel to one another from a surface of the non-conductive substrate opposite the grounding plate through the non-conductive substrate to the grounding plate. The RF PA circuitry is coupled to the grounding plate through a first one of the conductive vias. The RF power detection circuitry is coupled to a second one of the conductive vias and configured to measure a signal induced in the second one of the conductive vias due to electromagnetic coupling with the first one of conductive vias. The first one of the conductive vias is adjacent to the second one of the conductive vias.

20 Claims, 8 Drawing Sheets

(56) References Cited

U.S. PATENT DOCUMENTS

2015/0022209 A1* 1/2015 Halpern ............... A61B 5/055
324/318
2015/0288286 A1* 10/2015 Chu ............... H02M 3/33507
363/21.12

OTHER PUBLICATIONS

Cocchini, Matteo, et al., "Noise Coupling Between Power/Ground Nets Due to Differential Vias Transitions in a Multilayer PCB," IEEE International Symposium on Electromagnetic Compatibility, Aug. 2008, 6 pages.

Goldfarb, Marc E., et al., "Modeling Via Hole Grounds in Microstrip," IEEE Microwave and Guided Wave Letters, vol. 1, No. 6, Jun. 1991, pp. 135-137.

Gu, Qizheng, et al., "Coupled Noise Analysis for Adjacent Vias in Multilayered Digital Circuits," IEEE Transactions on Circuits and Systems—I: Fundamental Theory and Applications, vol. 41, No. 12, Dec. 1994, pp. 796-804.

Gu, Qizehng, et al., "Modeling and Analysis of Vias in Multilayered Integrated Circuits," IEEE Transactions on Microwave Theory and Techniques, vol. 41, No. 2, Feb. 1993, pp. 206-214.

Heinrich, G., et al., "Coupling between Vias and the PCB Power-Bus," Advances in Radio Science, www.adv-radio-sci.net/7/261/2009/, vol. 7, 2009, pp. 261-265.

Tarvainen, Timo, "Studies on Via Coupling on Multilayer Printed Circuit Boards," Ph.D. Thesis, Department of Electrical Engineering, University of Oulu, Finland, Apr. 23, 1999, 85 pages.

Tsang, Leung, et al., "Coupling of Vias in Electronic Packaging and Printed Circuit Board Structures with Finite Ground Plane," IEEE Transactions on Advanced Packaging, vol. 26, No. 4, Nov. 2003, pp. 375-384.

* cited by examiner

COMPACT POWER DETECTION CIRCUIT UTILIZING GROUND VIA COUPLING

RELATED APPLICATIONS

This application claims the benefit of U.S. provisional patent application serial No. 61/929,108, filed Jan. 19, 2014, the disclosure of which is incorporated herein by reference in its entirety.

FIELD OF THE DISCLOSURE

The present disclosure relates to radio frequency (RF) electronics modules, and in particular to power detection circuitry configured to measure an output power of RF power amplifier (PA) circuitry in an RF electronics module through electromagnetic coupling between adjacent conductive vias in the RF electronics module.

BACKGROUND

As radio frequency (RF) communications technology continues to evolve, the demands placed on RF power amplifier (PA) circuitry used to transmit RF signals proportionally increase. Strict requirements for noise, spectral masking, and transmit power mandated by modern RF communications standards combined with efficiency and reliability concerns generally demanded for consumer electronics require exceptionally high performance RF PA circuitry. One way to increase the performance of RF PA circuitry is by using a feedback loop of some kind. To implement a feedback loop for RF PA circuitry, a measurement of an RF output signal produced at an output of the RF PA circuitry must first be obtained. Generally, direct measurements of an RF output signal result in a reduction in the magnitude of the RF output signal and further may introduce noise and/or distortion into the RF output signal. Accordingly, RF power couplers are generally used to extract a portion of the RF output signal, which may then be used in a feedback loop to increase the performance of the RF PA circuitry.

FIG. 1 shows RF PA circuitry 10 including a conventional RF power coupler 12. The RF PA circuitry 10 includes an RF input node 14, an RF output node 16, and an RF PA 18 coupled between the RF input node 14 and the RF output node 16. Generally, the RF PA 18 includes one or more connections to ground as shown in FIG. 1. The conventional RF power coupler 12 includes a coupled port 20, an isolated port 22, and a coupling line 24. The isolated port 22 of the conventional RF power coupler 12 is coupled to ground via an isolation resistor $R_{IS}$. The coupling line 24 is arranged so that it runs parallel to an output line 26 of the RF PA circuitry 10. Electromagnetic coupling between the coupling line 24 and the output line 26 induce a signal at the coupled port 20 of the conventional RF power coupler 12 that is proportional to an RF output signal RF_OUT on the output line 26. The electromagnetic coupling generally has a minimal effect on the RF output signal RF_OUT, thereby allowing for an accurate measurement of the RF output signal RF_OUT without significant interference therewith.

Generally, the length $l_{CL}$ of the coupling line 24 is a quarter wavelength (λ/4) of a frequency of interest to be measured by the conventional RF power coupler 12. Providing the coupling line 24 with a length $l_{CL}$ that is a quarter wavelength of a frequency of interest generally results in satisfactory electromagnetic coupling between the coupling line 24 and the output line 26, while failing to significantly interfere with the RF output signal. Further, the coupling line 24 with a length $l_{CL}$ that is a quarter wavelength of a frequency of interest also results in a 90° phase shift in the RF output signal.

FIG. 2 shows a top view of a printed circuit board (PCB) 28 including the RF PA circuitry 10 and the conventional RF power coupler 12. As shown in FIG. 2, the RF input node 14 is located at a termination of a first conductive trace 30 on top of the PCB 28, while the RF output node 16 is located at a termination of a second conductive trace 32 on top of the PCB 28. The second conductive trace 32 correlates to the output line 26 discussed above with respect to FIG. 1. The RF PA 18 is a wirebond component including a first wirebond 34 connected to the first conductive trace 30 and a second wirebond 36 connected to the second conductive trace 32. While a wirebond component is shown for exemplary purposes, flip chip components or components utilizing any other packaging technology may also be used along with the PCB 28. The RF PA 18 may be mounted to the PCB 28 via a die flag 38, which may connect the RF PA 18 to a grounding plate (not shown) on a bottom side of the PCB 28. The conventional RF power coupler 12 is implemented with a third conductive trace 40. The third conductive trace 40 includes a portion that runs parallel to the second conductive trace 32 and correlates with the coupling line 24 discussed above with respect to FIG. 1. Notably, the portion of the third conductive trace 40 that runs parallel to the second conductive trace 32 has a length $l_{CL}$ that is about a quarter wavelength of a frequency of interest to be measured by the conventional RF power coupler 12, as discussed above. The coupled port 20 is located at a first end of the third conductive trace 40, while the isolated port 22 is located at an opposite end of the third conductive trace 40, and may connect to ground through a via into the PCB 28 to a ground plate (not shown) located on an opposite surface of the PCB 28.

While the conventional RF power coupler 12 is capable of indirectly measuring an RF output signal RF_OUT without significantly interfering therewith, the quarter wavelength coupling line 24 often results in the conventional RF power coupler 12 consuming a relative large area in the RF PA circuitry 10. Further, implementing the conventional RF power coupler 12 requires providing additional components in the conventional RF power coupler 12, thereby increasing the cost of the RF PA circuitry 10. Accordingly, there is a need for a compact RF power coupler that is easy to implement at a low cost.

SUMMARY

The present disclosure relates to radio frequency (RF) electronics modules, and in particular to power detection circuitry configured to measure an output power of RF power amplifier (PA) circuitry in an RF electronics module through electromagnetic coupling between adjacent conductive vias in the RF electronics module. In one embodiment, an RF electronics module includes a grounding plate, a non-conductive substrate, a number of conductive vias, RF PA circuitry, and RF power detection circuitry. The non-conductive substrate is over the grounding plate. The conductive vias extend parallel to one another from a surface of the non-conductive substrate opposite the grounding plate through the non-conductive substrate to the grounding plate. The RF PA circuitry is coupled to the grounding plate through a first one of the conductive vias. The RF power detection circuitry is coupled to a second one of the conductive vias and configured to measure a signal induced in the second one of the conductive vias due to electromagnetic coupling with the first one of conductive vias. The first one of the conductive vias is adjacent to the second one of the conductive vias. By measuring the signal induced in the second one of the conductive vias due to electromagnetic coupling with the first one of the conductive vias, the RF power detection circuitry is capable of indirectly measuring an output power of the RF PA circuitry while utilizing minimal area in the RF electronics module.

In one embodiment, a method includes providing an RF electronics module including a grounding plate, a non-conductive substrate, a number of conductive vias, and RF PA circuitry. The non-conductive substrate is over the grounding plate. The conductive vias extend parallel to one another from a surface of the non-conductive substrate opposite the grounding plate through the non-conductive substrate to the grounding plate. The RF PA circuitry is coupled to the grounding plate through a first one of the conductive vias. The method further includes measuring a signal induced in a second one of the conductive vias adjacent to the first one of the conductive vias to determine an output power of the RF PA circuitry. By measuring the signal induced in the second one of the conductive vias due to electromagnetic coupling with the first one of the conductive vias, the RF power detection circuitry is capable of indirectly measuring an output power of the RF PA circuitry while utilizing minimal area in the RF electronics module.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
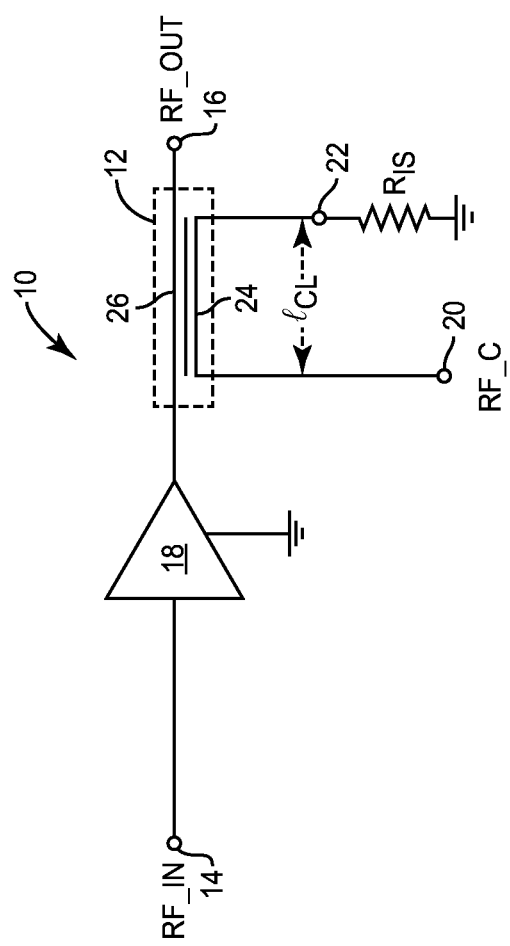
FIG. 1 shows radio frequency (RF) power amplifier (PA) circuitry including a conventional RF power coupler.
Figure 2:
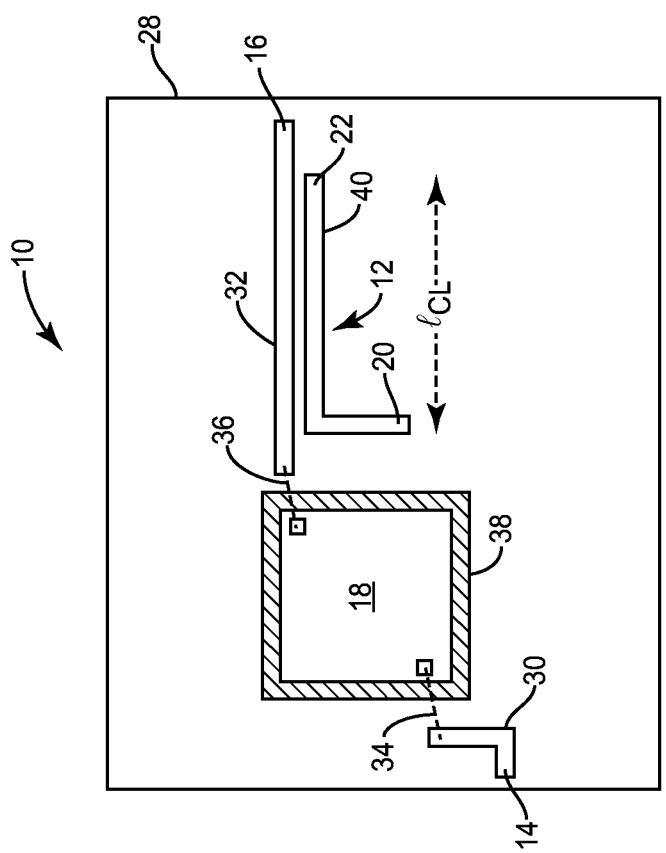
FIG. 2 shows details of the RF PA circuitry and the conventional RF power coupler shown in FIG. 1.
Figure 3:
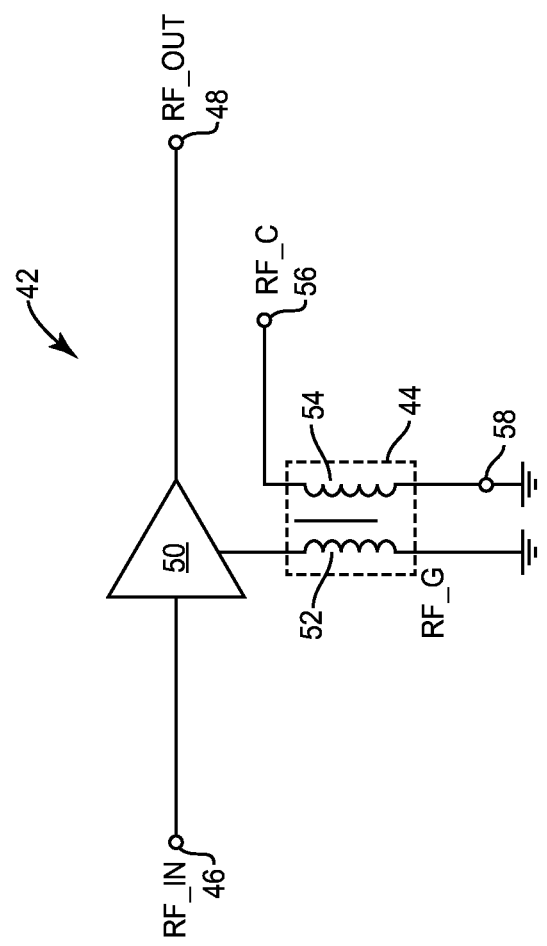
FIG. 3 shows RF PA circuitry including an RF power coupler according to one embodiment of the present disclosure.

FIG. 3 shows RF PA circuitry 42 including an RF power coupler 44 according to one embodiment of the present disclosure. The RF PA circuitry 42 includes an RF input node 46, an RF output node 48, an RF PA 50, and a first conductive via 52 coupling the RF PA 50 to ground. The RF power coupler 44 includes a second conductive via 54, which is adjacent to the first conductive via 52 coupling the RF PA 50 to ground, a coupled port 56, and an isolated port 58. The isolated port 58 of the RF power coupler 44 is directly connected to ground. The second conductive via 54 is in close enough proximity to the first conductive via 52 such that the two conductive vias are electromagnetically coupled. Accordingly, at least a portion of RF signals passing through the first conductive via 52 coupling the RF PA 50 to ground are transferred to the second conductive via 54 in the RF power coupler 44 as a coupled RF signal RF_C.

In operation, an RF input signal RF_IN is provided at the RF input node 46 and delivered to the RF PA 50. The RF PA 50 amplifies the RF input signal RF_IN to a level appropriate for transmission, for example, from an antenna (not shown), and provides the amplified signal as an RF output signal RF_OUT at the RF output node 48. Since the RF PA 50 is grounded through the first conductive via 52, a grounding signal RF_G proportional to the RF output signal RF_OUT is passed through the first conductive via 52. As discussed above, a portion of the grounding signal RF_G is electromagnetically coupled to the second conductive via 54 in the RF power coupler 44 and provided as a coupled RF signal RF_C. Notably, the coupled RF signal RF_C is proportional to the RF output signal RF_OUT and therefore may be used to measure one or more aspects thereof.

Using the second conductive via 54 in the RF power coupler 44 to indirectly measure one or more aspects of the RF output signal RF_OUT allows the RF power coupler 44 to remain extremely compact. In one embodiment, the second conductive via 54 in the RF power coupler 44 may be about ten times smaller than a quarter wavelength of the frequency of interest to be measured by the RF power coupler 44. In an additional embodiment, the second conductive via 54 may be about twenty times smaller than a quarter wavelength of the frequency of interest to be measured by the RF power coupler 44. In yet another embodiment, the second conductive via 54 may be about twenty five times smaller than a quarter wavelength of the frequency of interest to be measured by the RF power coupler 44. In general, the area required by the RF power coupler 44 is significantly smaller than that of a conventional RF power coupler, generally requiring up to 25 times less area to implement than conventional solutions.

Figure 4:
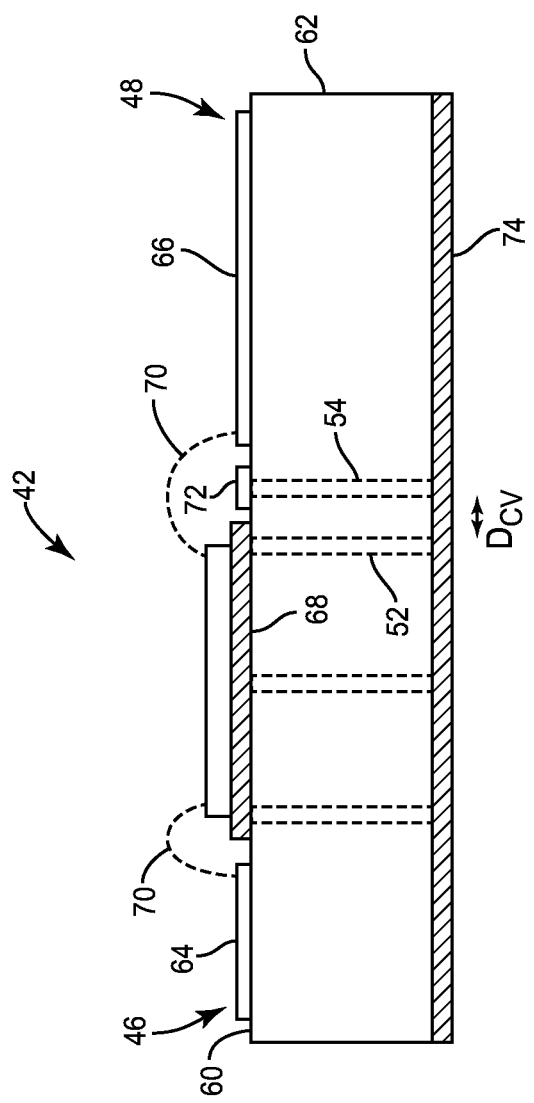
FIG. 4 shows details of the RF PA circuitry and the RF power coupler shown in FIG. 3 according to one embodiment of the present disclosure.

FIG. 4 shows a cross-section of a physical implementation of the RF PA circuitry 42 according to one embodiment of the present disclosure. The RF PA circuitry 42 is implemented on a first surface 60 of a printed circuit board (PCB) 62. The RF input node 46 is located at a termination of a first conductive trace 64 on the PCB 62. The RF output node 48 is located at a termination of a second conductive trace 66 on the PCB 62. The RF PA 50 is implemented as a wire bond component coupled to the PCB 62 via a conductive die flag 68, however, any suitable packaging technology may be used without departing from the principles of the present disclosure. Wire bonds 70 connect the RF PA 50 to the first conductive trace 64 and the second conductive trace 66. The coupled port 56 of the RF power coupler 44 is shown as a third conductive trace 72 on the first surface 60 of the PCB 62. The first conductive via 52 connects the conductive die flag 68 to a grounding plate 74 opposite the first surface 60 of the PCB 62. Additional conductive vias may also connect the conductive die flag 68 to the grounding plate 74, but are not labeled. The second conductive via 54 connects the third conductive trace 72 to the grounding plate 74. Notably, the second conductive via 54 is adjacent to the first conductive via 52 such that the first conductive via 52 and the second conductive via 54 are electromagnetically coupled. Accordingly, the coupled RF signal RF_C is obtained as discussed above with respect to FIG. 3.

In one embodiment, a distance $D_{CV}$ between the first conductive via 52 and the second conductive via 54 is less than about 280 um. In an additional embodiment, the distance $D_{CV}$ between the first conductive via 52 and the second conductive via 54 is less than about 130 um. In general, the minimum distance $D_{CV}$ between the first conductive via 52 and the second conductive via 54 will be limited by the fabrication process used for the PCB 62.

Figure 5:
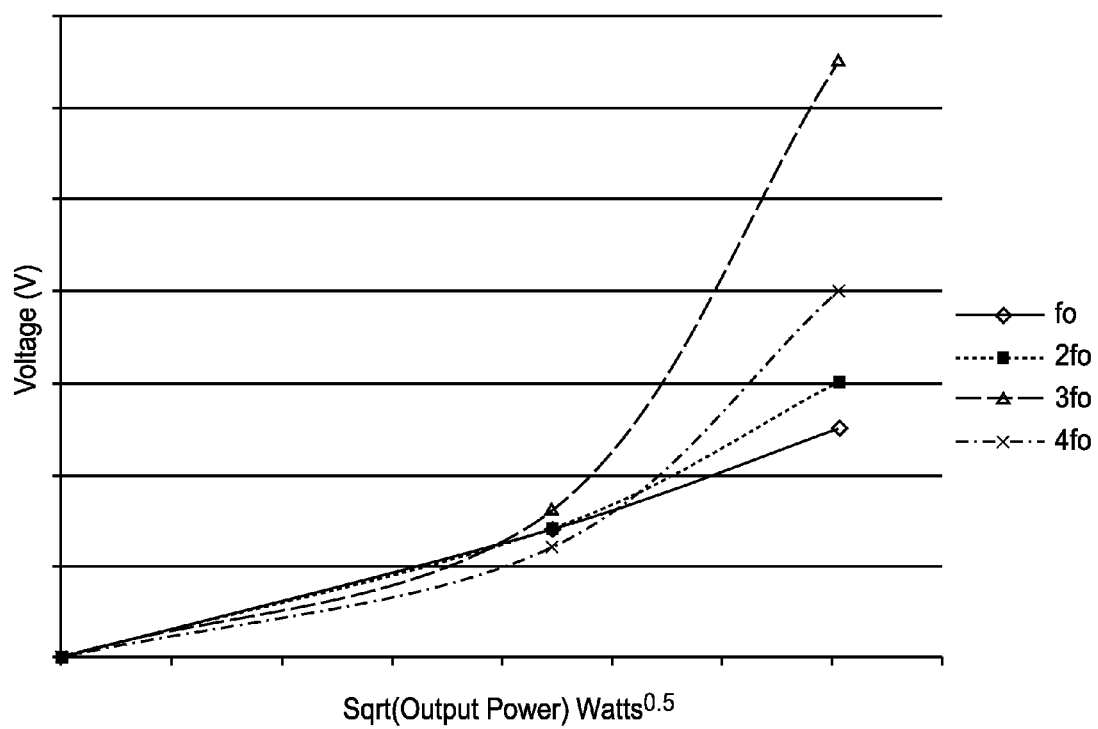
FIG. 5 is a graph illustrating a relationship between an RF output signal and a coupled RF signal according to one embodiment of the present disclosure.

FIG. 5 is a graph illustrating the relationship of various frequency components of the RF output signal RF_OUT to the coupled RF signal RF_C. As shown in FIG. 5, at the fundamental frequency $f_o$ of the RF output signal RF_OUT, the coupled RF signal RF_C has a linear relationship with the square root of the RF output signal RF_OUT. At the second harmonic $2f_o$ of the RF output signal RF_OUT, the coupled RF signal RF_C also has a relatively linear relationship with the square root of the RF output signal RF_OUT. As the order of the harmonic increases, the relationship of the coupled RF signal RF_C to the square root of the RF output signal RF_OUT becomes more exponential and less linear, as shown in FIG. 5. In general, there is a defined relationship between the RF output signal RF_OUT and the coupled RF signal RF_C at various frequency components thereof, thereby allowing one to use the coupled RF signal RF_C to indirectly measure and approximate the RF output signal RF_OUT.

Figure 6:
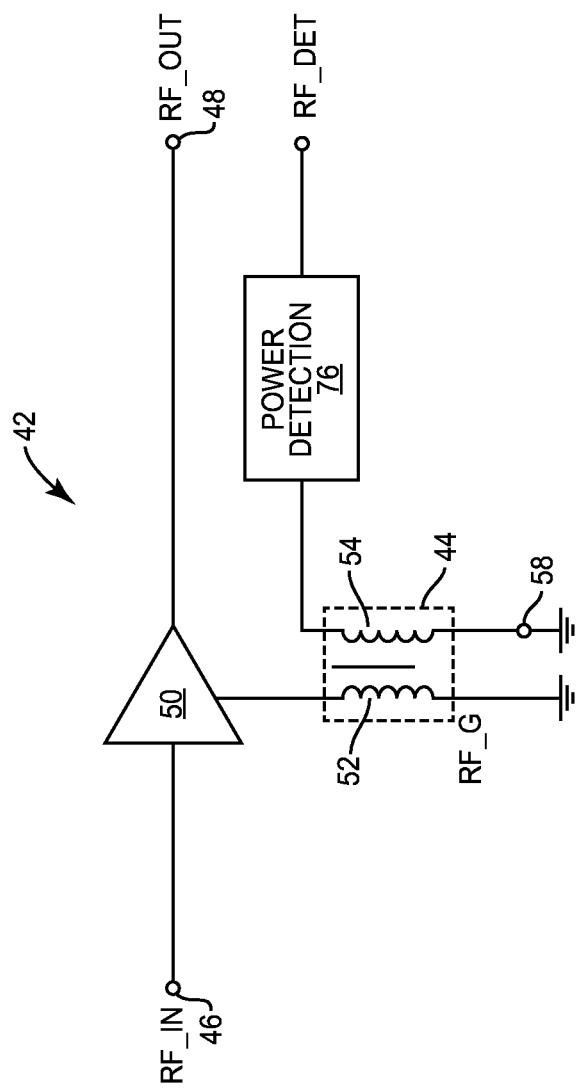
FIG. 6 shows the RF PA circuitry and the RF power coupler shown in FIG. 3 further including RF power detection circuitry according to one embodiment of the present disclosure.

FIG. 6 shows the RF PA circuitry 42 according to an additional embodiment of the present disclosure. The RF PA circuitry 42 shown in FIG. 6 is substantially similar to that shown in FIG. 3, but further includes RF power detection circuitry 76 connected to the RF power coupler 44. The RF power detection circuitry 76 is configured to receive and condition the coupled RF signal RF_C to provide an RF detection voltage signal RF_DET. In one embodiment, the RF power detection circuitry 76 filters the coupled RF signal RF_C to isolate one or more frequency components thereof. In an additional embodiment, the RF power detection circuitry 76 amplifies the coupled RF signal RF_C. In general, the RF power detection circuitry 76 conditions the coupled RF signal RF_C in one or more ways to provide the RF detection voltage signal RF_DET.

Figure 7:
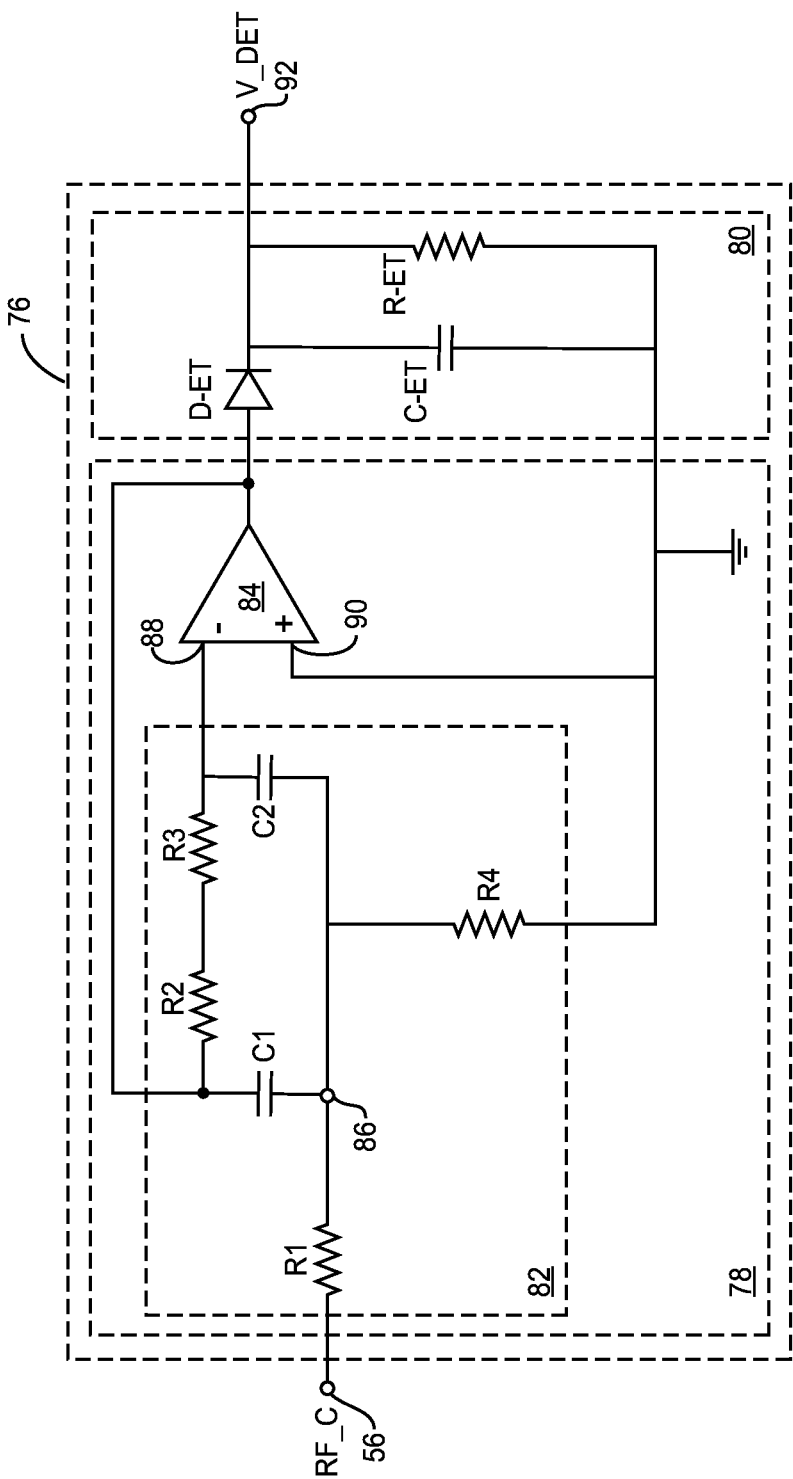
FIG. 7 shows details of the RF power detection circuitry shown in FIG. 6 according to on embodiment of the present disclosure.

FIG. 7 shows details of the RF power detection circuitry 76 according to one embodiment of the present disclosure. The RF power detection circuitry 76 includes filtration and amplification circuitry 78 and envelope detection circuitry 80. The filtration and amplification circuitry 78 includes filtering circuitry 82 and an operational amplifier 84. The filtering circuitry 82 includes a first resistor R1 connected between the coupled port 56 of the RF power coupler 44 and a first filtering node 86. A first filtering capacitor C1 is coupled in series with a second filtering resistor R2 and a third filtering resistor R3 between the first filtering node 86 and a first input 88 to the operational amplifier 84. A fourth filtering resistor R4 is coupled between the first filtering node 86 and ground. A second input 90 to the operational amplifier 84 is also coupled to ground.

The envelope detection circuitry 80 includes an envelope detection diode D_ET including an anode coupled to an output of the operational amplifier 84 and a cathode coupled to an output node 92 of the RF power detection circuitry 76. Further, the envelope detection circuitry 80 includes an envelope tracking capacitor C_ET and an envelope tracking resistor R_ET coupled between the output node 92 of the RF power detection circuitry 76 and ground.

In operation, the filtration and amplification circuitry 78 acts as a bandpass filter, isolating a desired frequency band of the coupled RF signal RF_C and amplifying it. The envelope detection circuitry 80 tracks an envelope of the output signal from the operational amplifier 84 to provide the RF detection voltage signal V_DET. Notably, the details of the RF power detection circuitry 76 shown in FIG. 7 are merely exemplary. That is, the RF power detection circuitry 76 can be implemented in any number of ways and perform any type of signal conditioning on the coupled RF signal RF_C without departing from the principles of the present disclosure.

Figure 8:
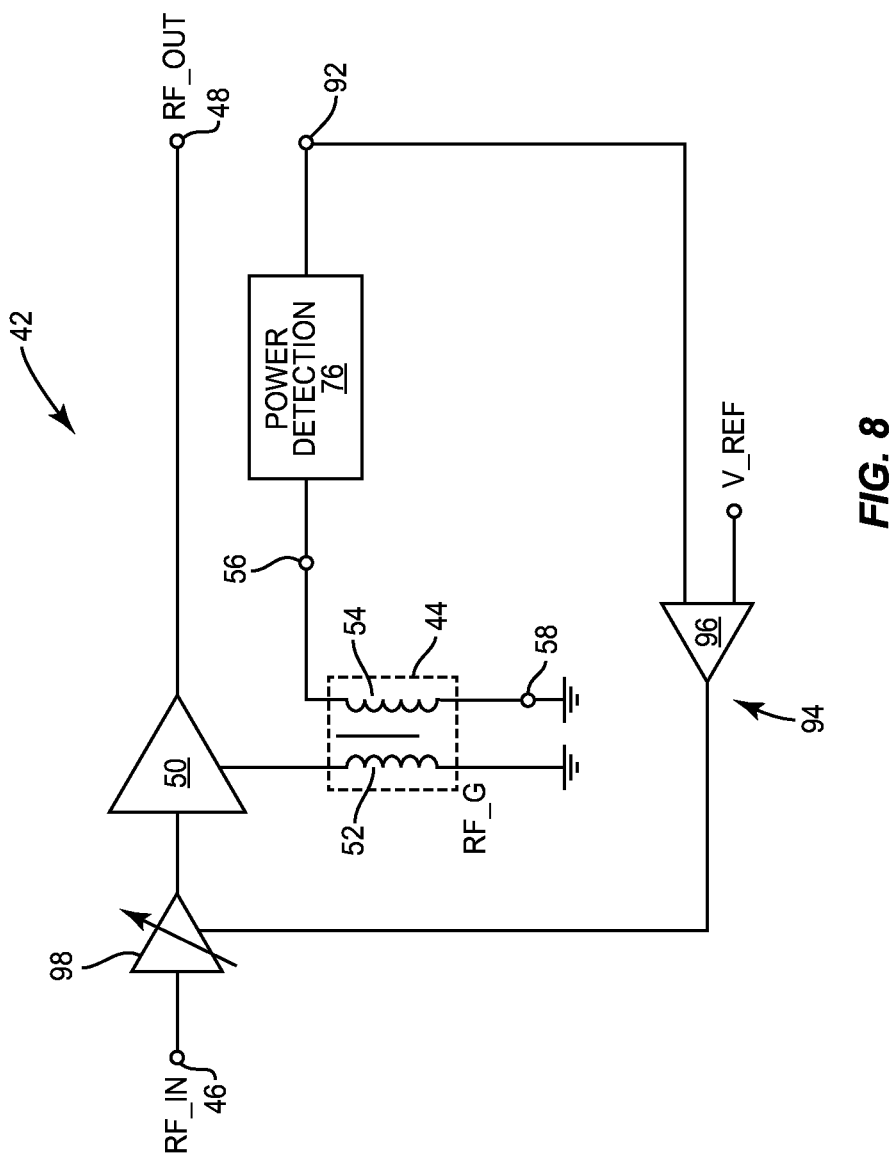
FIG. 8 shows the RF PA circuitry and the RF power coupler shown in FIG. 3 integrated into a feedback loop according to one embodiment of the present disclosure.

FIG. 8 shows the RF PA circuitry 42 including an analog feedback loop 94 according to one embodiment of the present disclosure. The feedback loop 94 includes the RF power coupler 44, the RF power detection circuitry 76, an error amplifier 96, and a variable gain amplifier 98. The error amplifier 96 includes a first input connected to the RF power detection circuitry 76 and a second input connected to a reference voltage V_REF. An output of the error amplifier 96 is connected to the variable gain amplifier 98 such that gain control signal G_C controls a gain of the variable gain amplifier 98.

In operation, the coupled RF signal RF_C is delivered to the RF power detection circuitry 76, where it is conditioned as desired and provided as the RF detection voltage signal RF_DET. The RF detection voltage signal RF_DET is then compared to the reference voltage V_REF by the error amplifier 96. The resulting gain control signal G_C is provided to the variable gain amplifier 98, which is coupled between the RF input node 46 and the RF PA 50. By changing the gain of the variable gain amplifier 98, the output power of the RF PA 50 may also be adjusted. Accordingly, the feedback loop 94 may control one or more aspects of the operation of the RF PA 50 to increase the performance thereof. Additional embodiments may use an analog to digital (A/D) converter to implement the power control digitally.

Those skilled in the art will recognize improvements and modifications to the embodiments of the present disclosure. All such improvements and modifications are considered within the scope of the concepts disclosed herein and the claims that follow.

What is claimed is:

1. A radio frequency (RF) electronics module comprising:
   a grounding plate;
   a non-conductive substrate over the grounding plate;
   a plurality of conductive vias extending parallel to one another from a surface of the non-conductive substrate opposite the grounding plate through the non-conductive substrate to the grounding plate;
   RF power amplifier (PA) circuitry coupled to the grounding plate through a first one of the plurality of conductive vias; and
   RF power detection circuitry coupled to a second one of the plurality of conductive vias and configured to measure a signal induced in the second one of the plurality of conductive vias due to electromagnetic coupling with the first one of the plurality of conductive vias, wherein the first one of the plurality of conductive vias is adjacent to the second one of the plurality of conductive vias.

2. The RF electronics module of claim 1 wherein the RF PA circuitry is configured to receive an RF input signal and provide an amplified RF output signal.

3. The RF electronics module of claim 1 wherein the RF PA circuitry is a wire bond component mounted to the non-conductive substrate via a conductive die flag.

4. The RF electronics module of claim 3 wherein the RF PA circuitry is coupled to the conductive die flag, which is in turn coupled to the grounding plate through the first one of the plurality of conductive vias.

5. The RF electronics module of claim 1 wherein a length of the second one of the plurality of conductive vias is about 10 times smaller than a quarter wavelength of a fundamental frequency of the signal induced in the second one of the plurality of conductive vias due to electromagnetic coupling with the first one of the plurality of conductive vias.

6. The RF electronics module of claim 1 wherein the first one of the plurality of conductive vias is less than about 300 μm from the second one of the plurality of conductive vias.

7. The RF electronics module of claim 6 wherein the first one of the plurality of conductive vias is greater than about 50 μm from the second one of the plurality of conductive vias.

8. The RF electronics module of claim 1 wherein the RF PA circuitry includes a multi-stage RF PA.

9. The RF electronics module of claim 1 wherein the RF power detection circuitry is a complementary metal-oxide-semiconductor (CMOS) integrated circuit (IC).

10. The RF electronics module of claim 1 wherein the RF power detection circuitry forms part of a closed-loop power control system for the RF PA circuitry.

11. The RF electronics module of claim 10 wherein the closed-loop power control system includes a variable gain amplifier (VGA) coupled in series with the RF PA circuitry such that an output of the VGA is coupled to an input of the RF PA circuitry.

12. The RF electronics module of claim 11 wherein an output signal from the RF power detection circuitry is used to adjust a gain response of the VGA.

13. The RF electronics module of claim 12 wherein the VGA is configured to receive an RF input signal and provide an amplified RF intermediate signal to the RF PA circuitry, which is configured to further amplify the RF intermediate signal to provide the RF output signal.

14. The RF electronics module of claim 1 wherein the RF power detection circuitry comprises an operational amplifier configured to amplify the signal induced in the second one of the plurality of conductive vias due to electromagnetic coupling with the first one of the plurality of conductive vias.

15. The RF electronics module of claim 14 wherein the RF power detection circuitry further comprises a filter configured to attenuate signals outside of a desired frequency band in the signal induced in the second one of the plurality of conductive vias due to electromagnetic coupling with the first one of the plurality of conductive vias.

16. The RF electronics module of claim 15 wherein the RF power detection circuitry further comprises envelope detector circuitry.

17. The RF electronics module of claim 1 wherein an output from the RF power detection circuitry is used to limit input power to the RF PA circuitry at certain voltage standing wave ratio (VSWR) angles.

18. The RF electronics module of claim 1 wherein the RF power detection circuitry is configured to detect one or more harmonic components within the signal induced in the second one of the plurality of conductive vias due to electromagnetic coupling with the first one of the plurality of conductive vias.

19. The RF electronics module of claim 1 wherein an output from the RF power detection circuitry is used to control a bias signal provided to the RF PA circuitry.

20. A method comprising:
   providing a radio frequency (RF) electronics module comprising:
      a grounding plate;
      a non-conductive substrate over the grounding plate;
      a plurality of conductive vias extending parallel to one another from a surface of the non-conductive substrate opposite the grounding plate through the non-conductive substrate to the grounding plate; and
      RF power amplifier (PA) circuitry coupled to the grounding plate through a first one of the plurality of conductive vias; and
   measuring a signal induced in a second one of the plurality of conductive vias adjacent to the first one of the plurality of conductive vias to determine an output power of the RF PA circuitry.

* * * * *